United States Patent [19]
Yang et al.

[11] Patent Number: 6,074,956
[45] Date of Patent: Jun. 13, 2000

[54] METHOD FOR PREVENTING SILICIDE RESIDUE FORMATION IN A SEMICONDUCTOR DEVICE

[75] Inventors: Wenge Yang, Fremont; Lewis Shen, Cupertino, both of Calif.

[73] Assignee: Advanced Micro Devices, Inc., Sunnyvale, Calif.

[21] Appl. No.: 09/076,663

[22] Filed: May 12, 1998

[51] Int. Cl.[7] ...................... H01L 21/461; H01L 21/4763
[52] U.S. Cl. .................. 438/721; 438/588; 438/592; 438/593; 438/655; 438/657; 438/669; 438/683; 438/114; 438/738
[58] Field of Search ..................................... 438/592, 593, 438/588, 648, 655, 657, 669, 683, 710, 711, 714, 721, 729, 735, 738

[56] References Cited

U.S. PATENT DOCUMENTS

| | | | |
|---|---|---|---|
| 4,443,930 | 4/1984 | Hwang ........................................ | 29/571 |
| 5,342,801 | 8/1994 | Perry et al. ................................ | 437/52 |
| 5,792,710 | 8/1998 | Yoshida et al. .......................... | 438/721 |
| 5,851,926 | 12/1998 | Kumar et al. ............................ | 438/714 |
| 5,880,033 | 3/1999 | Tsai ........................................ | 438/710 |

*Primary Examiner*—John F. Niebling
*Assistant Examiner*—Ha Tran Nguyen

[57] ABSTRACT

An etching process is provided for etching through a tungsten silicide layer and an underlying polysilicon layer during the formation of a control gate in a semiconductor device. The etching process prevents the formation of a tungsten silicide residue while etching a layer of tungsten silicide, by employing a plasma that exhibits strong physical sputtering capabilities. The plasma effectively etches away exposed portions of the silicide layer, especially in narrow patterned regions. The plasma exhibits an etching selectivity (ratio of tungsten silicide etch rate to polysilicon etch rate) that is less than about 1.0.

5 Claims, 3 Drawing Sheets

METHOD FOR PREVENTING SILICIDE RESIDUE FORMATION IN A SEMICONDUCTOR DEVICE

RELATED APPLICATIONS

This application is related to co-pending application Ser. No. 09/076,662, filed, May 12, 1998, entitled Methods For Removing Silicide Residue in a Semiconductor.

TECHNICAL FIELD

The present invention relates to semiconductor devices and manufacturing processes, and more particularly to methods associated with preventing formation of a silicide residue, which can form in certain semiconductor devices during fabrication.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit-line and a word-line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit-line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a portion of a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon deposited over the exposed portions of substrate 12, tunnel oxide 15, and field oxides 14a–b. Interpoly dielectric layer 24 has been conformally deposited over the exposed portions of floating gates 16a–c and field oxide regions 14a–b. Interpoly dielectric layer 24 isolates floating gates 16a–c from the next conformal layer which is typically a polysilicon layer that is subsequently patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

Control gate 26, which is one of a plurality of control gate structures, is formed over interpoly dielectric layer 24 by depositing a layer of polysilicon on interpoly dielectric layer 24. Next, silicide layer 28 is formed on interpoly dielectric 24. Additional layers of material may also be deposited over silicide layer 28, such as, cap layer 30, and one or more dielectric layers 32 and 33, for example. Cap layer 30 is typically a layer of polysilicon that reduces stress in the silicide layer 28. Dielectric layers 32 and 33 typically include silicon dioxide, silicon oxynitride and/or silicon nitride, which are formed using conventional deposition techniques. The resulting layers are then selectively patterned to form control gate structures.

The shrinking of semiconductor devices, and in particular the features depicted in the memory cells of FIGS. 1a–b, places a burden on the fabrication processes, because the shape, size and location of floating and control gate structures are of fundamental importance to the memory cell. In certain reduced-size semiconductor devices, such as, for example, the memory cells in FIGS. 1a–b, selective etching processes can cause a silicide residue to form during the etching away of selected portions of silicide layer 28. This silicide residue hinders the subsequent etching of the underlying layer, for example, an underlying layer of polysilicon. Thus, there is a need for methods for controlling the formation processes, such as a control gate etching process, to prevent the formation of silicide residue.

SUMMARY OF THE INVENTION

In accordance with certain aspects of the present invention, it has been found that, for certain semiconductor devices, the underlying floating gates and/or other structures tend to cause varying thickness in the overlying layers, for example, an overlying polysilicon layer and subsequently formed silicide layer. This varying thickness can present problems during the formation of the device features that are formed from these overlying layers. For example, a silicide residue can form during the selective etching of the silicide layer in regions where the silicide is thicker.

In accordance with other certain aspects of the present invention, it has been found that certain silicide layers, such as, for example, a tungsten silicide layer, are not necessarily homogeneous and that differing concentrations of the refractory or near noble metal used to form the silicide, for example, tungsten, can affect the etching process during formation of the control gate structures. For example, higher concentrations of tungsten towards the bottom of the silicide layer can lead to the formation of silicide residue.

As such, improved methods are needed to effectively control the patterning of a silicide layer and/or the underlying layer(s) to account for varying thickness', non-homogeneous materials, etching rates, and other concerns (e.g., loading, microloading, over/under-etching, etc.), which are exacerbated by the shrinkage of the semiconductor device's features.

The above-stated needs and others are met by the present invention, which provides methods that increase the process control during the fabrication of semiconductor devices by preventing the formation of silicide residue during the selective etching of a silicide material.

Thus, in accordance with certain embodiments of the present invention, a method for fabricating a semiconductor device is provided. The method includes forming a first gate structure on a substrate, forming at least one dielectric material on the first gate structure, forming a layer stack on the dielectric material, wherein the layer stack includes a second gate material that is formed on the dielectric material and a silicide that is formed on the second gate material. The method further includes selectively removing a portion of the layer stack using a plasma having an etching rate selectivity of tungsten silicide to polysilicon of less than about 1.0, to expose a portion of the underlying dielectric material. In accordance with certain embodiments of the present invention, the second gate material includes polysilicon and the silicide includes tungsten.

In accordance with certain other embodiments of the present invention, the etching process is conducted in an etching tool, having a source power supply and a bias power supply, and includes supplying between about 300 and about 2000 Watts of electrical energy from the source power supply to the etching tool and between about 120 and about 200 Watts of electrical energy from the bias power supply to the etching tool to generate the plasma from an etchant chemistry comprising a mixture of $Cl_2/N_2/He-O_2$ gasses.

The above stated needs are also met by a method for etching through a silicide during fabrication of a semiconductor device, in accordance with certain embodiments of the present invention. The method includes supplying an etchant chemistry to an etching tool, and etching into selected portions of a silicide layer and an underlying polysilicon layer using a plasma generated from the etchant chemistry. In this method, the plasma exhibits an etching rate selectivity of silicide to polysilicon of less than about 1.0.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 2:
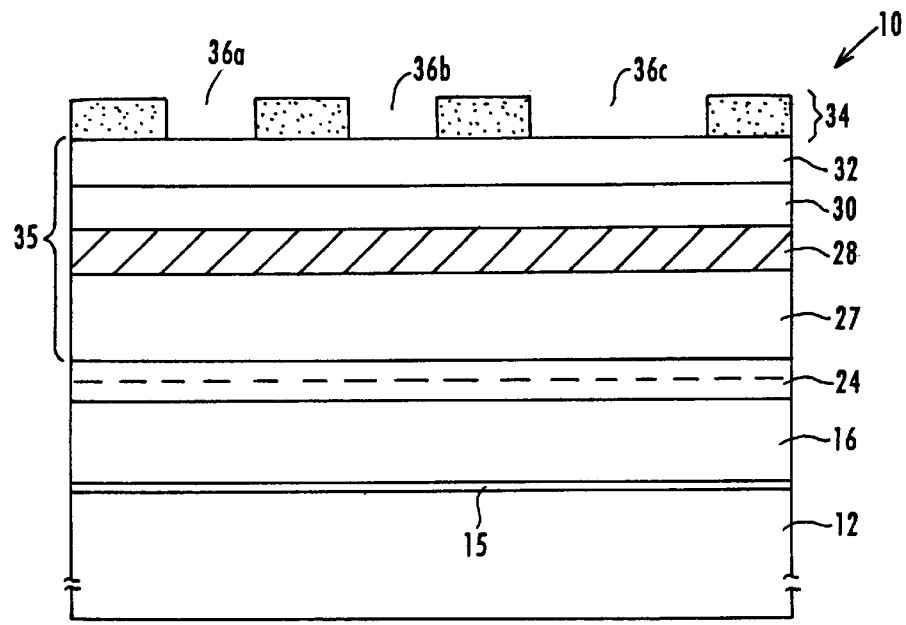
FIG. 2 depicts a cross-sectional view of a portion of a semiconductor device having a plurality of layers, including a silicide layer and an underlying polysilicon layer, that has been prepared to be selectively etched to form a control gate structure.

FIG. 2 depicts a portion 10 of a semiconductor device having a plurality of layers that have been prepared for a selective etching process in which a control gate structure is formed. As shown, the exemplary portion in FIG. 2 includes a substrate 12, a tunnel oxide 15, a floating gate 16, an interpoly dielectric layer 24, and a layer stack 35. Layer stack 35, from which one or more control gate structures can be formed, includes a control gate polysilicon layer 27, a silicide layer 28, a cap layer 30, and a dielectric layer 32. To prepare the layer stack 35 for selective etching, a conventional photoresist mask 34, having etching windows 36a–c, is formed on dielectric layer 32.

The various layers of portion 10 are formed using conventional semiconductor fabrication techniques and tools. By way of example, the polysilicon used to form floating gate 16, control gate 26 and cap layer 30 can be deposited using conventional deposition techniques, such as, for example, chemical vapor deposition (CVD) or plasma enhanced CVD (PECVD) techniques. Similarly, the dielectric materials used to form tunnel oxide 15, interpoly dielectric 24, and dielectric layer 32 can be grown and/or deposited using conventional processes.

Layer stack 35 is typically patterned to form a control gate structure by anisotropically etching away portions of the layer stack 35 through etching windows 36a, 36b and 36c, using a patterning process that employs conventional etching techniques and tools, such as, for example, reactive ion etching (RIE) and/or plasma etching techniques and tools. This patterning process sequentially etches into the layer stack 35 and endpoints on interpoly dielectric layer 24. The photoresist mask 34 is then removed or stripped away, for example, using conventional stripping techniques, and additional layers added to complete the semiconductor device fabrication process.

Figure 1A:
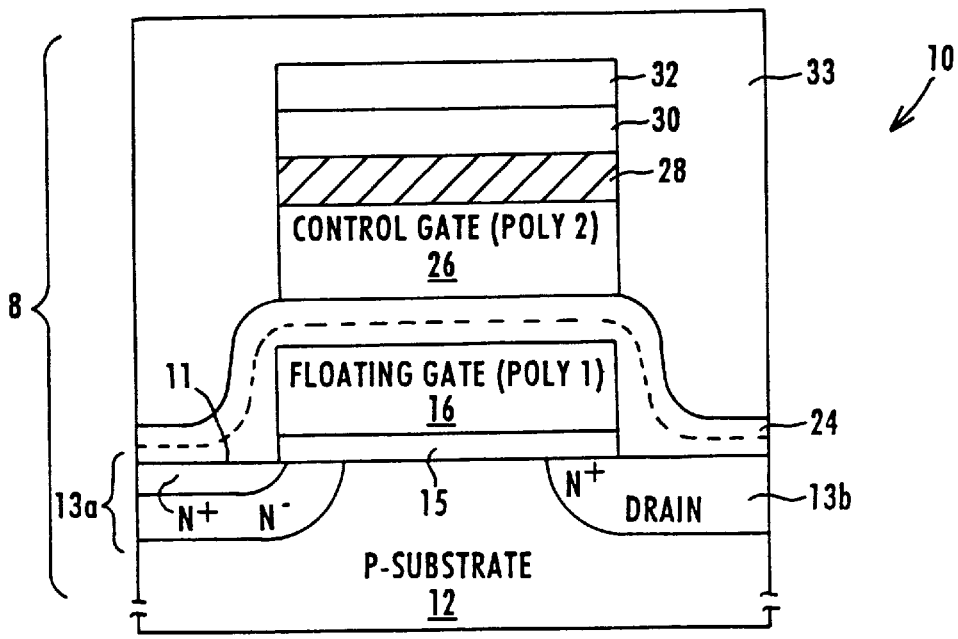
FIG. 1a depicts a cross-sectional view of a portion of a typical prior art semiconductor device having at least one memory cell, as viewed through a section along a bit-line.
Figure 1B:
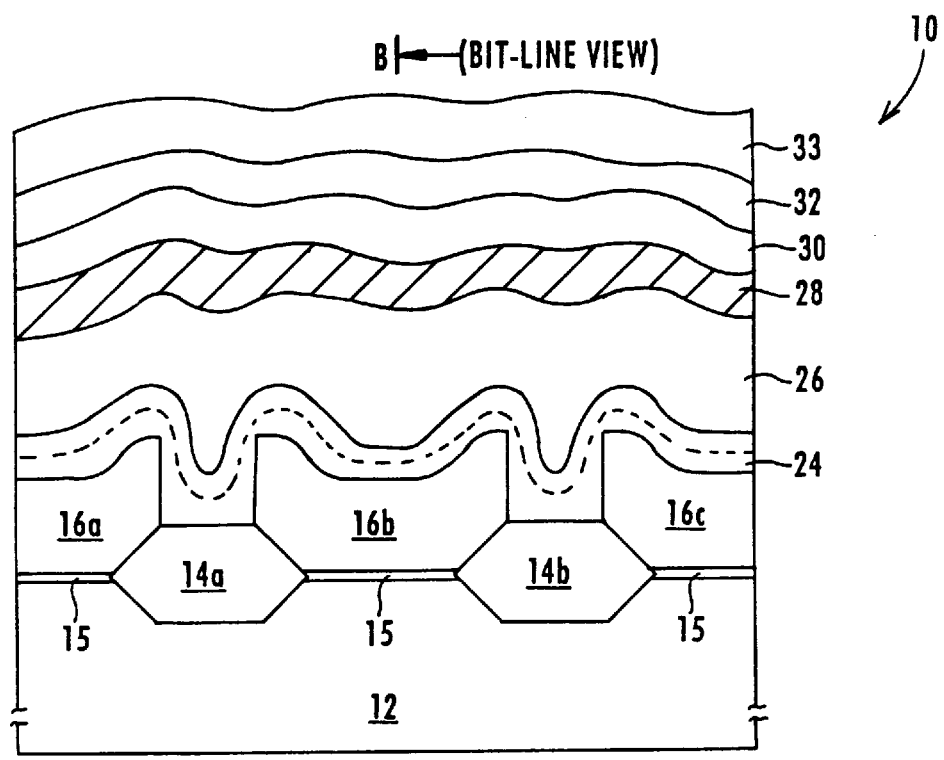
FIG. 1b depicts a cross-sectional view of a portion of a typical prior art semiconductor device having at least one memory cell, as viewed through a section along a word-line.

In accordance with certain embodiments of the present invention, floating gate 16 is typically about 900 to 1,100 Angstroms thick, and interpoly dielectric layer 24 is about 170 Angstroms thick. Interpoly dielectric layer 24 is preferably an ONO (oxide-nitride-oxide) layer that is formed, for example, by a three stage process in which a first film of silicon dioxide (e.g., about 50 Angstroms thick) is deposited or grown, followed by deposition of a second film of silicon nitride (e.g., about 80 Angstroms thick), and then a third film of silicon dioxide (e.g., about 40 Angstroms thick) is deposited or grown. The ONO layer provides a thin, highly insulating dielectric layer that separates the floating gate 16 from the control gate 26, as depicted in FIG. 1a. The control gate polysilicon layer 27 is then conformally deposited on the interpoly dielectric layer 24 to an average thickness of about 1,200 Angstroms using conventional deposition techniques. Silicide layer 28, for example, tungsten silicide (e.g., $WSi_2$), is then formed on the control gate polysilicon layer 27 to a thickness of about 1,500 Angstroms. Next, cap layer 30, which is preferably a polysilicon layer, is deposited on silicide layer 28 to a thickness of about 500 Angstroms. Dielectric layer 32, which in certain embodiments is a layer of silicon dioxide, silicon nitride (e.g., SiN), or silicon oxynitride (e.g., SiON), is deposited on cap layer 30 to a thickness of about 1,000 Angstroms. Note that for purposes of illustration, portion 10 in FIG. 2 has been drawn as having layers that are substantially planar and of uniform thickness, although such is not required.

Figure 3:
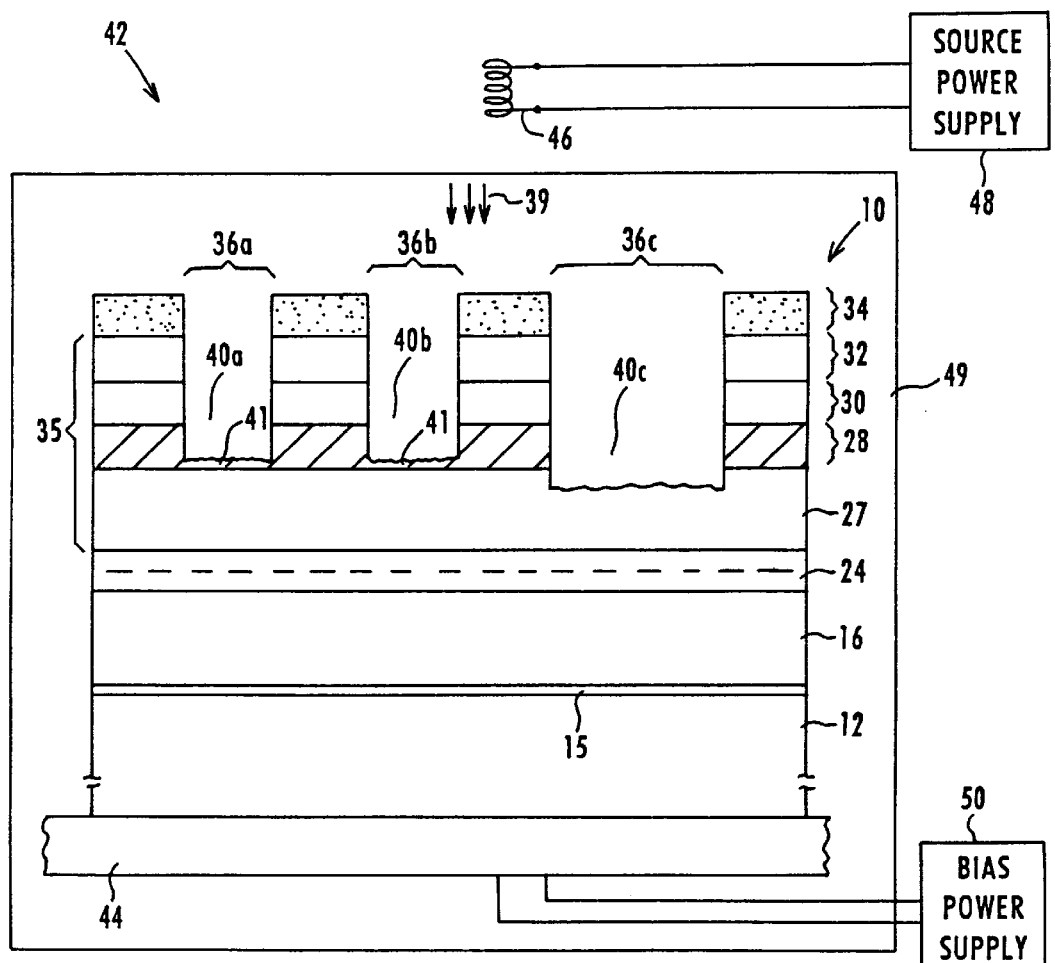
FIG. 3 depicts the portion of FIG. 2 after having been placed in an etching tool and undergoing a conventional etching process that failed to effectively remove all of the silicide layer.
Figure 4A:
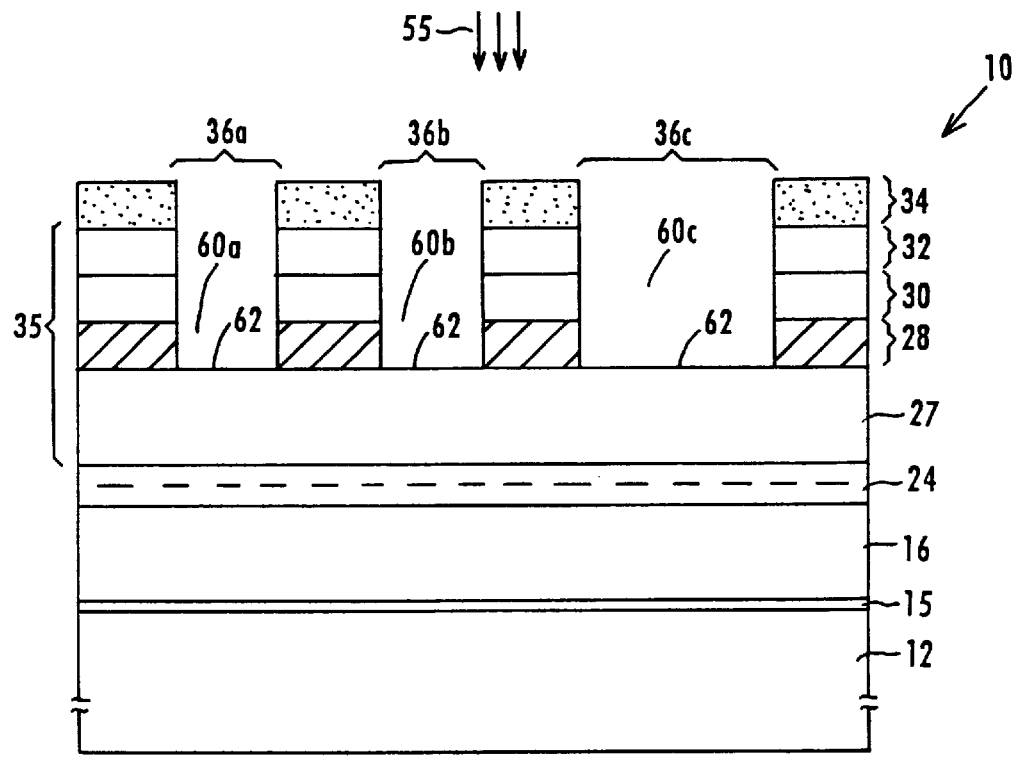
FIG. 4a depicts the portion of FIG. 2 after having been placed in an etching tool and undergoing an etching process, in accordance with certain embodiments of the present invention, that has effectively etched through the silicide layer.
Figure 4B:
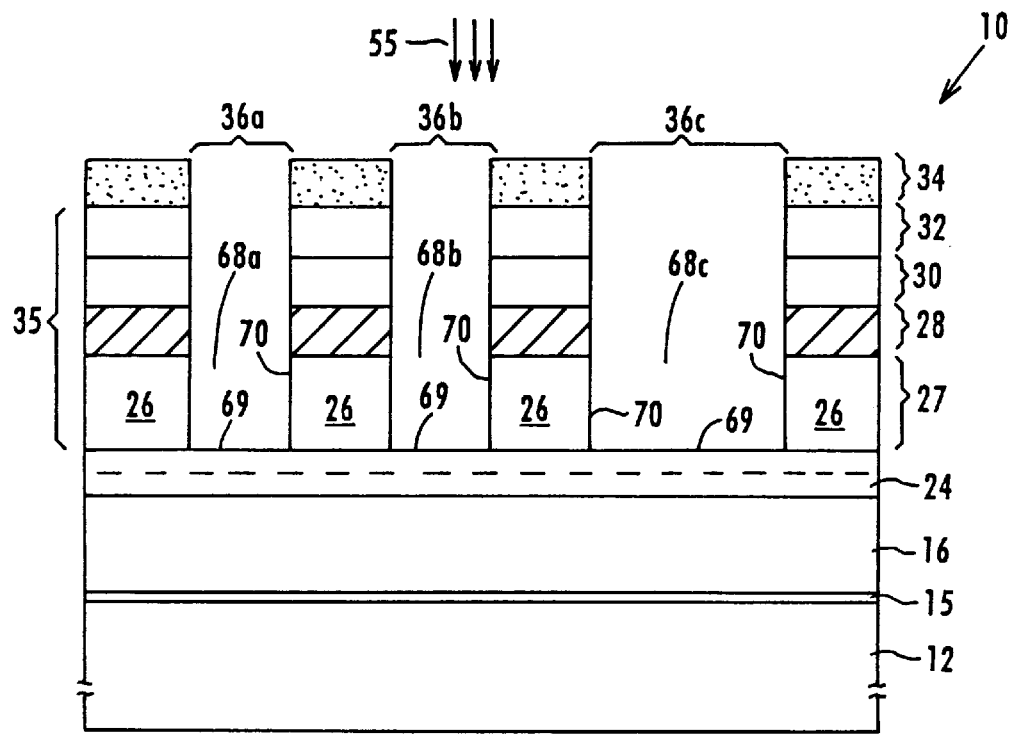
FIG. 4b depicts the portion of FIG. 4a following continued etching which has effectively etched through exposed portions of the underlying polysilicon layer to complete the formation of several control gate structures, in accordance with certain embodiments of the present invention.

As described below, FIG. 3 presents exemplary etching related problems that have been found to exist in certain semiconductor devices, and FIGS. 4a and 4b present an exemplary solution to these types of problems, which are associated with selective etching of the silicide layer 28 and control gate polysilicon layer 27 during formation of one or more control gate structures. As such, in the structures and methods shown in these figures it is assumed that any overlying layers of material (e.g., layers 32 and 30 in FIG. 2) have already been selectively etched using conventional etching techniques, as known in the art.

In FIG. 3, portion 10 of FIG. 2 has been placed within an etching tool 42 and exposed to a plasma 39 that is configured to etch through the silicide layer 28 and then through the control gate polysilicon layer 27. Plasma 39 is typically configured to etch through silicide layer 28 and polysilicon layer 27 at about the same rate (e.g., exhibiting a selectivity of about 1.0), in order to maintain a substantially vertical profile.

As shown, plasma 39 has been used to remove exposed portions of silicide layer 28 through windows 36a, 36b and 36c, thereby forming etched openings 40a, 40b and 40c, respectively. Notice that a silicide residue 41 has formed in openings 40a and 40b. In certain embodiments, silicide residue 41 is believed to include a higher concentration of the refractory metal, e.g., tungsten, which is more difficult for plasma 39 to etch away when compared to silicide having lower concentrations of the refractory metal. Silicide residue 41 is also believed to form due to differences in the thickness of silicide layer 28. Notice, however, that etched opening 40c, which is depicted as extending into control gate polysilicon layer 27, does not have a silicide residue. It is believed that the narrower openings of windows 36a and 36b, as compared to window 36c, and the resulting higher aspect ratios of the etched openings 40a, 40b, as compared to etched opening 40c, tends to lead to silicide residue formation due to microloading effects.

Etching tool 42, in accordance with certain exemplary embodiments, is an AMAT Decoupled Plasma Source (DPS) etcher, available from Applied Materials of Santa Clara, Calif. Etching tool 42 includes a bottom or bias electrode 44 and a top or source electrode 46. Source electrode 46 is electrically coupled to source power supply 48. Source power supply 48 is configured to output electrical energy (e.g., radio frequency (RF) energy) to the source electrode 46, which generates plasma 39 by applying an electrical field to various gasses within a reactor chamber 49. Bias electrode 44, which also serves as a chuck to hold the semiconductor wafer associated with portion 10 during etching, is electrically coupled to bias power supply 50. Bias power supply 50 is configured to output direct current (DC) electrical energy to bias electrode 44, which negatively charges the bias electrode 44 causing positively charged ions in the plasma 39 to be attracted and accelerated towards the exposed surfaces of the semiconductor wafer (e.g., portion 10).

As shown, etched openings 40a and 40b do not extend through silicide layer 28, however, etched opening 40c is already through silicide layer 28 and has etched into the control gate polysilicon layer 27. As this example demonstrates, the different etching rates associated with the formation of silicide residue 41 in etched openings 40a, 40b (and the lack thereof in etched opening 40c), present process control problems that can lead to over-etching and/or under-etching of layer stack 35 during the formation of the control gate structures. For example, in certain embodiments, if plasma is applied for a long enough period of time then etched opening 40c will extend through control gate polysilicon layer 27 and begin etching exposed portions of interpoly dielectric layer 24, while etched openings 40a and 40b will remain substantially unchanged in depth due to the relative inability of the plasma 39 to etch through silicide residue 41.

As mentioned above, it is believed that the formation of silicide residue 41 and consequently different etching rates are at least partially caused by the differences in widths of windows 36a, 36b and 36c, and/or the effectiveness of plasma 39 within the width of a particular window. For example, because windows 36a and 36b present higher aspect ratios (i.e., a ratio of height to width) than does window 36c, the effectiveness (e.g., etch rate, sputtering, etc.) of the physical attributes of plasma 39 within windows 36a and 36b appears to be reduced. Other potential causes for the formation of silicide residue layer 41 have to do with the composition and proportions of silicide layer 28 itself. For example, in certain embodiments, it was found that silicide layer 28 can be non-homogeneous. Thus, for example, tungsten silicide layer 28 can have a higher concentration of tungsten nearer the interface between the silicide layer 28 and the control gate polysilicon layer 27. This increased concentration of tungsten tends to further reduce the effectiveness of plasma 39, especially within the windows/openings having higher aspect ratios. It has also been found that the thickness of silicide layer 28 tends to vary depending upon the underlying topology. This varying thickness of silicide layer 28 can also lead to the formation of silicide residue 41 during formation.

In accordance with certain embodiments of the present invention, methods are provided for an etching process that overcomes the problems described above by preventing the formation of silicide residue 41.

FIG. 4a depicts the portion of FIG. 2 following an exemplary etching process, in accordance with certain embodiments of the present invention. The etching process, which is completed in a conventional etching tool 42 (e.g., see FIG. 3), employs a plasma 55, which is configured to etch away selected portions of silicide layer 28 through windows 36a, 36b and 36c, thereby forming initial etched openings 60a, 60b and 60c, respectively. As shown, initial etched openings 60a and 60b do not extend significantly through silicide layer 28, and do not leave any remaining amount of silicide layer 28 (e.g., silicide residue 41), therein. As shown in the exemplary embodiment of FIG. 4a, initial etched openings 60a–c extend through the silicide layer 28 and expose portions of a surface 62 of control gate polysilicon layer 27.

FIG. 4b depicts the portion of FIG. 4a following a continued etching process, in accordance with certain embodiments of the present invention. The etching process is completed in etching tool 42, and employs plasma 55 to etch away the exposed portions of control gate polysilicon layer 27, thereby forming etched openings 68a, 68b and 68c. As shown, etched openings 68a, 68b and 68c extend through layer stack 35 and expose portions of a surface 69 of the underlying interpoly dielectric layer 24.

Conventional wisdom would lead one of ordinary skill to believe that increasing the silicide etching rate of the plasma 39 would prevent the formation of silicide residue 41. However, contrary to conventional wisdom, in the present invention the plasma 55 is configured to exhibit a slower silicide etching rate and a lower selectivity of the silicide layer 28 to polysilicon layer 27, than does plasma 39. Selectivity, as used in this context, refers to a ratio of etching rates for two different layers of materials (e.g., tungsten silicide versus polysilicon) for a given plasma. Thus, for example, the selectivity exhibited by plasma 55 to silicide layer 28 versus polysilicon layer 27 is less than about 1.0, in accordance with certain embodiments of the present invention, while the selectivity exhibited by plasma 39 is about 1.0. Consequently, when compared to plasma 39, plasma 55 tends to etch away the exposed portions of silicide layer 28 at a slower relative rate than the polysilicon layer 27.

Plasmas 39 and 55 can be considered as having at least two contributing factors that affect the resulting etching rate for a given material. The first factor is the chemical etching capabilities of the etchant gasses, which are used to form the plasmas, with respect to the materials they contact. The second factor is the physical capabilities of the etchant gasses to remove materials upon impact (e.g., sputtering). Normally, increasing either of these factors for a given material versus another material tends to change the selectivity of the resulting plasma.

In accordance with certain embodiments of the present invention, a difference between plasma 39 and plasma 55 is that the selectivity (i.e., silicide etching rate versus polysilicon etching rate) exhibited by plasma 55 has been established by adjusting the amount of electrical energy output by the source and bias power supplies, 48 and 50, respectively.

Thus, in accordance with certain exemplary embodiments of the present invention, plasma 55 is generated using a gas mixture that includes $Cl_2/N_2/He-O_2$. By way of example, for an AMAT DPS etcher, the gas mixture employed to generate plasma 55 includes between about 80 and about 90 percent $Cl_2$ gas, between about 1 and about 10 percent $N_2$ gas, and between about 1 and about 10 percent $He-O_2$ gas mixture. In certain preferred embodiments, plasma 55 exhibits a selectivity (i.e., tungsten silicide etching rate versus polysilicon etching rate) of about 0.8. In the exemplary AMAT DPS polysilicon etcher this selectivity is controlled by maintaining the output of the source power supply 48 between about 300 and about 500 Watts, and the output of the bias power supply 50 between about 120 and about 200 Watts. For purposes of comparison, plasma 39 exhibits a selectivity (i.e., tungsten silicide etching rate versus polysilicon etching rate) of about 1.0 using the same chemistry, when the output of the source power supply 48 is about 1600 Watts and the output of the bias power supply 50 is about 100 Watts.

As mentioned above, simply etching through silicide layer 28 and control gate polysilicon layer 27 using a conventionally configured plasma 39 tends to cause the formation of silicide residue. Unfortunately, increasing the silicide etch rate/selectivity tends to produce a control gate structure having tapered sidewalls, rather than the desirable substantially vertical sidewalls (for example, as depicted in FIG. 4b). It was also found that increasing the selectivity by modifying the etchant chemistry presented additional control problems associated, for example, with the profile of the control gate structure and over/under-etching, for example, into interpoly dielectric layer 24. It therefore appears that the microloading effects that tend to contribute to the formation of silicide residue 41 are more attributable to the lack of physical etching capability provided by plasma 39. As such, plasma 55 is configured to provide an increased physical etching capability that effectively removes the exposed portions of silicide layer 28 without forming silicide residue 41. While the etching rate exhibited by plasma 55 to silicide layer 28 is significantly slower than that exhibited by plasma 39, there is an attendant increase in the process control. It was unexpectedly found that reducing the selectivity, rather than increasing the selectivity, exhibited by plasma 55 actually provided a more physically aggressive etching capability, especially within the narrower openings (e.g., see windows 36a and 36b). Moreover, to avoid other potential control and profile problems during the etching process, it was found that such a reduction in etch rate/selectivity is best accomplished by adjusting the outputs of the source and bias power supplies, 48 and 50, in the manner described above.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A method for fabricating a semiconductor device, the method comprising:

forming a gate structure on a substrate;

forming at least one dielectric material on the gate structure;

forming a layer stack on the dielectric material, the layer stack comprising a polysilicon gate material that is formed on the dielectric material and a tungsten silicide that is formed on the polysilicon gate material; and adjusting an amount of electrical energy output by source and bias power supplies to substantially prevent silicide formation during a selective removal of a portion of the layer stack using a plasma having an etching rate selectivity of tungsten silicide to polysilicon of less than about 1.0, to expose a portion of the underlying dielectric material.

2. The method as recited in claim 1, wherein the plasma exhibits an etching rate selectivity of tungsten silicide to polysilicon of about 0.8.

3. The method as recited in claim 1, wherein said selective removal is performed in an etching tool having a source power supply and a bias power supply, and the step of selectively removing includes supplying between about 300 and about 2000 Watts of electrical energy from the source power supply to the etching tool and between about 120 and about 200 Watts of electrical energy from the bias power supply to the etching tool to generate the plasma from an etchant chemistry comprising a mixture of $Cl_2/N_2/He-O_2$ gasses.

4. The method as recited in claim 3, wherein the etchant chemistry comprises between about 80 and about 90 percent $Cl_2$ gas, between about 1 and about 10 percent $N_2$ gas, and between about 1 and about 10 percent $He-O_2$ gas mixture.

5. The method as recited in claim 1, wherein the layer stack further includes at least one layer of materials over the silicide, the layer of materials selected from a set of materials including polysilicon, silicon dioxide, silicon nitride, and silicon oxynitride.

* * * * *